United States Patent [19]

Ushirokawa

[11] Patent Number: 5,323,422
[45] Date of Patent: Jun. 21, 1994

[54] ADAPTIVE RECEIVER APPARATUS
[75] Inventor: Akihisa Ushirokawa, Tokyo, Japan
[73] Assignee: NEC Corporation, Tokyo, Japan
[21] Appl. No.: 983,142
[22] Filed: Nov. 30, 1992
[30] Foreign Application Priority Data
Nov. 29, 1991 [JP] Japan .................. 3-315847
[51] Int. Cl.$^5$ .............................. H03H 7/30
[52] U.S. Cl. ...................... 375/14; 375/99; 364/724.2
[58] Field of Search .......... 375/12, 14, 94, 99, 375/101, 103; 328/18, 164; 364/724.2

[56] References Cited
U.S. PATENT DOCUMENTS

| 4,718,073 | 1/1988 | Takaoka | 375/14 |
| 4,870,657 | 9/1989 | Bergmans et al. | 375/99 |
| 5,175,747 | 12/1992 | Murakami | 333/18 |

OTHER PUBLICATIONS

C. F. N. Cowan and P. M. Grant, "Adaptive Filter", Prentice Hall, Inc., England, 1985.
Eleftheriou, et al., "Tracking Properties and Steady-State Performance of RLS Adaptive Filter Algorithms", IEEE Transactions on Acoustics, Speech, and Signal Processing, vol. ASSP-34, No. 5, Oct. 1986, pp. 1097-1110.

Primary Examiner—Stephen Chin
Attorney, Agent, or Firm—Foley & Lardner

[57] ABSTRACT

An adaptive receiver apparatus including a demodulating circuit for demodulating a reception signal, an adaptive equalizer for equalizing a demodulated output to output a demodulated signal, a difference signal upon equalization and a channel impulse response estimate estimated upon equalization, a noise level detector for detecting a noise level based on the difference signal upon equalization, a channel impulse response variation magnitude detector for detecting a variation in the magnitude of the impulse response estimate at a predetermined level, and a coefficient controller for adjusting a coefficient determining a tracking property of an adaptive algorithm of the adaptive equalizer depending on the variation magnitude of the channel impulse response estimate detected by the channel impulse response variation magnitude detector and the noise level detected by the noise level detector.

11 Claims, 15 Drawing Sheets

FIG. 14

| NOISE LEVEL<br>FADING PITCH fd | HIGH | LOW |
|---|---|---|
| SMALL<br>(LOW SPEED) | STEP SIZE PARAMETER SMALL<br>FORGETTING FACTOR LARGE | STEP SIZE PARAMETER SMALL<br>FORGETTING FACTOR LARGE |
| MEDIUM<br>(MEDIUM SPEED) | STEP SIZE PARAMETER MEDIUM<br>FORGETTING FACTOR MEDIUM | STEP SIZE PARAMETER MEDIUM<br>FORGETTING FACTOR MEDIUM |
| HIGH<br>(HIGH SPEED) | STEP SIZE PARAMETER MEDIUM<br>FORGETTING FACTOR MEDIUM | STEP SIZE PARAMETER LARGE<br>FORGETTING FACTOR SMALL |

FIG. 15

| NOISE LEVEL<br>FADING PITCH fd | HIGH | LOW |
|---|---|---|
| SMALL<br>(LOW SPEED) | STEP SIZE PARAMETER SMALL<br>FORGETTING FACTOR LARGE | STEP SIZE PARAMETER SMALL<br>FORGETTING FACTOR LARGE |
| MEDIUM<br>(MEDIUM SPEED) | STEP SIZE PARAMETER MEDIUM<br>FORGETTING FACTOR MEDIUM | STEP SIZE PARAMETER MEDIUM<br>FORGETTING FACTOR MEDIUM |
| HIGH<br>(HIGH SPEED) | STEP SIZE PARAMETER LARGE<br>FORGETTING FACTOR SMALL | STEP SIZE PARAMETER MEDIUM<br>FORGETTING FACTOR MEDIUM |

ADAPTIVE RECEIVER APPARATUS

BACKGROUND OF THE INVENTION

The present invention related generally to an adaptive receiver apparatus. More specifically, the invention relates to an adaptive receiver apparatus which adaptively equalizes reception signals following variations of channel characteristics in time sequence in a digital mobile communication system.

In a digital mobile communication system, since a radio wave is received through a plurality of paths, it is important to overcome the problem of irregular variations of the levels of reception signals, i.e. the so-called problem of multi-path fading during traveling. In particular, when the lag time difference between reflected waves reaching a receiver apparatus is large relative to a time interval of a transmission signal cannot be ignored. Accordingly, an adaptive equalization technology for equalizing wave form distortion following variations of channel characteristics is an important technology.

An adaptive equalizer initially derives a channel impulse response upon reception of known data sequence signals. Thereafter, the adaptive equalizer sequentially updates the channel impulse response employing an adaptive algorithm, such as the LMS (Least-Means-Squares) algorithm, RLS (Recursive Least-Squares) algorithm, and so forth, using decision signals as reference data sequence signals, upon reception of information data sequence signals for following sequential variations of the channel characteristics. The adaptive algorithm is discussed in C. F. N. Cowan and P. M. Grant, "Adaptive Filters", Prentice-Hall, Inc. England, 1985, for example. The disclosure in the above-identified publication is herein incorporated by reference for the sake of disclosure. However, in the adaptive equalization algorithm, it has been known to trade-off between a tracking speed (converging speed) and a tracking precision (residual error upon convergence). For example, in the LMS algorithm, when a correction coefficient, i.e. step size parameter defining a tracking property, is set at a relatively large value, high tracking speed can be achieved while tracking precision is lowered. On the other hand, when the step size parameter is set at a relatively small value, high tracking precision can be achieved by sacrificing the tracking speed. Similarly, in the case of the RLS algorithm, by setting a forgetting factor at a relatively small valve, high tracking speed can be achieved while the tracking precision is lowered. On the other hand, when the forgetting factor is increased to be close to 1, the tracking precision can be increased while the tracking speed is sacrificed.

In mobile communication, a traveling speed of a mobile station is not constant and, rather, varies sequentially. It is also known to attain excellent equalization characteristics by providing higher priority for the tracking precision rather than the tracking speed at a low traveling speed where a time-variation is moderate, and provide higher priority for the tracking speed rather than the tracking precision at a high traveling speed where the time-variation is rapid. For example, relevant discussion has been given in E. Eleftheriou and D. D. Falconer, "Tracking Properties and Steady-State Performance of RLS Adaptive Filter Algorithms", IEEE Transaction on Acoustics, Speech and Signal Processing, vol. ASSP-34, No. 5, pp 1097~1110, October, 1986. Accordingly, there exist no optimal values for the coefficient defining the tracking property at any condition, to make it difficult to preliminarily set this coefficient. In other words, even when the coefficient is set at one factor, it is not possible to attain the optimal equalization effect.

SUMMARY OF THE INVENTION

It is an object of the present invention to provide an adaptive receiver apparatus which can equalize wave form distortion with optimum tracking property at any condition by adaptively varying the tracking property of an equalizer depending upon variation of a channel impulse response.

In order to accomplish the above-mentioned and other objects, an adaptive receiver apparatus, according to one aspect of the invention, comprises:

demodulating means for demodulating a reception signal;

adaptive equalization means for equalizing a demodulated output to output an equalized signal, an error signal upon equalization and a channel impulse response estimate estimated upon equalization;

noise level detecting means for detecting a noise level based on the error signal upon equalization;

channel impulse response variation magnitude detecting means for detecting a variation magnitude of the channel impulse response estimate at a predetermined interval; and coefficient control means for adjusting a coefficient determining a tracking property of an adaptive algorithm of the adaptive equalization means depending upon the variation magnitude of the channel impulse response estimate detected by the channel impulse response variation magnitude detecting means and the noise level detected by the noise level detecting means.

Practically, the adaptive algorithm may be a least-means-squares (LMS) algorithm or a recursive-least-squares (RLS) algorithm, and the coefficient is a a step size parameter or forgetting factor.

According to another aspect of the invention, an adaptive receiver apparatus comprises:

demodulating means for demodulating a reception signal;

adaptive equalization means for equalizing a demodulated output to output an equalized signal, an error signal upon equalization and a channel impulse response estimate estimated upon equalization;

signal level detecting means for receiving a signal level of the reception signal channel impulse response variation magnitude detecting means for detecting a variation magnitude of the channel impulse response estimate at a predetermined interval; and coefficient control means for adjusting a coefficient determining a tracking property of an adaptive algorithm of the adaptive equalization means depending upon the variation magnitude of the channel impulse response estimate detected by the channel impulse response variation magnitude detecting means and the signal level detected by the signal level detecting means.

According to a still further aspect of the invention, an adaptive receiver apparatus for receiving a burst transmission signal with adaptive equalization according to an adaptive algorithm, comprises:

demodulating means for demodulating a reception signal;

adaptive equalization means for equalizing a demodulated output to output an equalized signal, an error signal upon equalization and a channel impulse response estimate estimated upon equalization;

noise level detecting means for detecting a noise level based on the error signal upon equalization;

channel impulse response variation magnitude detecting means for detecting a variation magnitude of the channel impulse response estimate at a predetermined interval;

first averaging means for averaging the outputs of the channel impulse response variation detecting means over a given period within a burst with respect to each burst;

second averaging means for averaging the outputs of the first averaging means over a plurality of bursts; and coefficient control means for adjusting a coefficient determining a tracking property of the adaptive algorithm of the adaptive equalization means depending upon the output of the second averaging means and the noise level detected by the noise level detecting means, with respect to each burst.

According to a still further aspect of the invention, an adaptive receiver apparatus for receiving a burst transmission signal with adaptive equalization according to an adaptive algorithm, comprises:

demodulating means for demodulating a reception signal;

adaptive equalization means for equalizing a demodulated output to output an equalized signal, an error signal upon equalization and a channel impulse response estimate estimated upon equalization;

signal level detecting means for detecting a signal level of the reception signal;

channel impulse response variation magnitude detecting means for detecting a variation magnitude of the channel impulse response estimate at a predetermined interval;

first averaging means for averaging outputs of the channel impulse response variation detecting means over a given period within a burst with respect to each burst;

second averaging means for averaging the outputs of the first averaging means over a plurality of bursts; and coefficient control means for adjusting a coefficient determining a tracking property of the adaptive algorithm of the adaptive equalization means depending upon the output of the second averaging means and the signal detected by the signal level detecting means, with respect to each burst.

Preferably, the given period in the burst, over which the first average means active for averaging is a training sequence period.

According to a still further aspect of the invention, an adaptive receiver apparatus comprises:

demodulating means for demodulating a reception signal;

adaptive equalization means for equalizing a demodulated output to output an equalized signal, an error signal upon equalization and a channel characteristics representative parameter estimated upon equalization;

environmental condition detecting means for detecting an environmental condition representative parameter affecting reception of the reception signal;

channel characteristics variation magnitude detecting means for detecting a variation magnitude of the channel characteristics representative parameter at a predetermined interval; and coefficient control means for adjusting a coefficient determining a tracking property of an adaptive algorithm of the adaptive equalization means depending upon the variation magnitude of the channel characteristics representative parameter and the channel status representative parameter.

According to a yet further aspect of the invention, an adaptive receiver apparatus for receiving a burst transmission signal with adaptive equalization according to an adaptive algorithm, comprises:

demodulating means for demodulating a reception signal;

adaptive equalization means for equalizing a demodulated output to output an equalized signal, an error signal upon equalization and a channel characteristics representative parameter estimated upon equalization;

channel status detecting means for detecting an channel status representative parameter affecting reception of the reception signal;

channel characteristics variation magnitude detecting means for detecting a variation magnitude of the channel characteristics representative parameter at a predetermined interval;

first averaging the means for averaging outputs of the channel characteristics variation detecting means over a given period within a burst with respect to each burst;

second averaging means for averaging the outputs of the first averaging means over a plurality of bursts; and coefficient control means for adjusting a coefficient determining a tracking property of the adaptive algorithm of the adaptive equalization means depending upon the output of the second averaging means and the channel status detecting means, with respect to each burst.

According to a still further aspect of the invention, an adaptive receiver apparatus for a mobile communication system, comprises:

demodulating means for receiving a radio wave signal and demodulating the received signal into a demodulated signal;

equalizing means for equalizing the demodulated signal according to an adaptive algorithm to output an equalized signal, the adaptive algorithm being provided a tracking property variable depending upon a coefficient;

estimating means active in cooperation with the equalizing means for estimating a channel characteristics representative parameter for generating a first parameter;

detector means for detecting an channel status affecting reception of the radio wave signal to produce a second parameter; and coefficient determining means for determining the coefficient on the basis of a variation of the first parameter and the second parameter for providing an optimal tracking property for the adaptive algorithm.

BRIEF DESCRIPTION OF THE DRAWINGS

The present invention will be understood more fully from the detailed description given herebelow and from the accompanying drawings of the preferred embodiment of the invention, which, however, should not be taken to the invention, but taken only for explanation and understanding:

In the drawings:

FIG. 14 is an illustration showing a manner of coefficient control in a coefficient control circuit in the embodiments of FIGS. 1 and 3; and FIG. 15 is an illustration showing a manner of coefficient control in a coefficient control circuit in the embodiments of FIGS. 2 and 4.

DESCRIPTION OF THE PREFERRED EMBODIMENT

Figure 9:
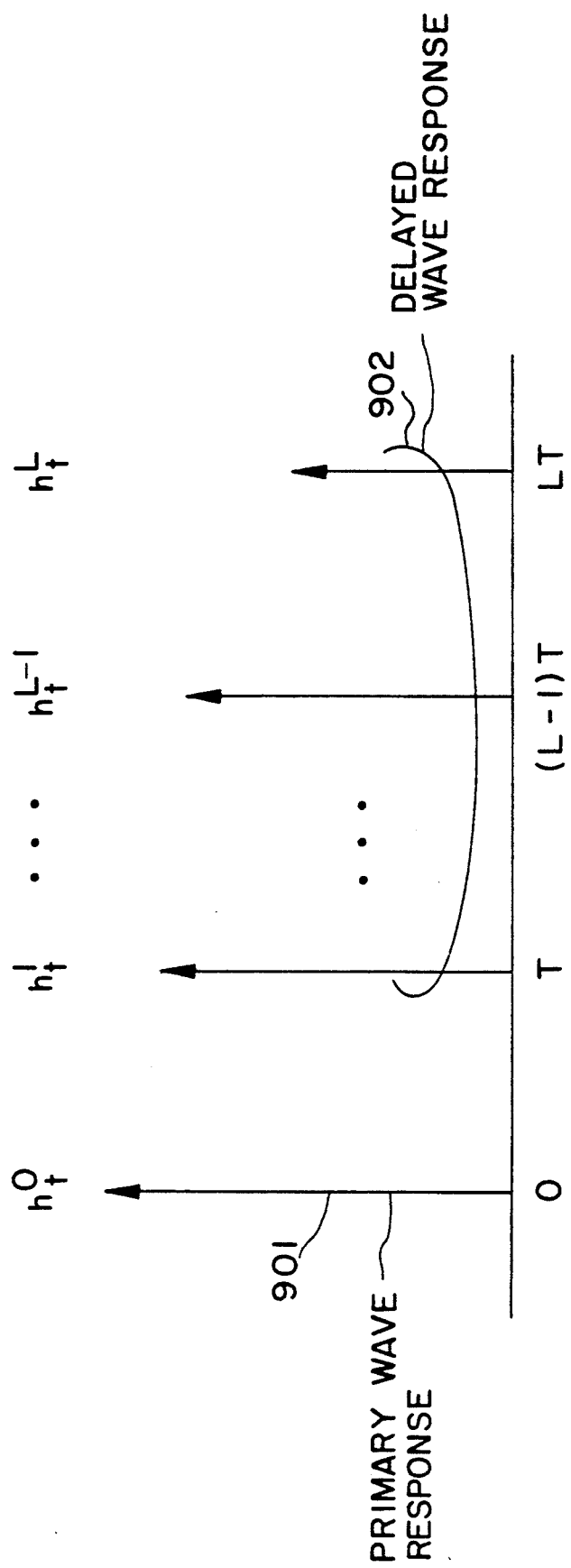
FIG. 9 is an illustration of a channel impulse response.

The present invention will be discussed in greater detail with reference to the accompanied drawings. In the following description, without losing generality, consideration will be given to a channel, in which a plurality of delayed wave responses 902 for delayed waves are present in addition to a primary response 901 for a primary wave, as shown in FIG. 9. Here, it is assumed that a channel impulse response is expressed by a vector $\bar{h}_t^T = (h_t^0, h_t^1, \ldots, h_t^L)$, a transmitted signal sequence is expressed by $\bar{S}_t^T = (S_t, S_{t-1}, \ldots S_{t-L})$, and an additive channel noise including a measurement process independent of the transmitted signal is assumed as $V_t$. The superscript T means transposition of a vector or a matrix, herebelow. At this time, an input $r_t$ of a receiver at a time t is given as a sum of the vector $\bar{h}_t$, the vector $S_t$ and a convolution and a noise, as expressed by the following equation.

$$r_t = \bar{S}_t^T \cdot \bar{h}_t + v_t \quad (1)$$

Figure 10:
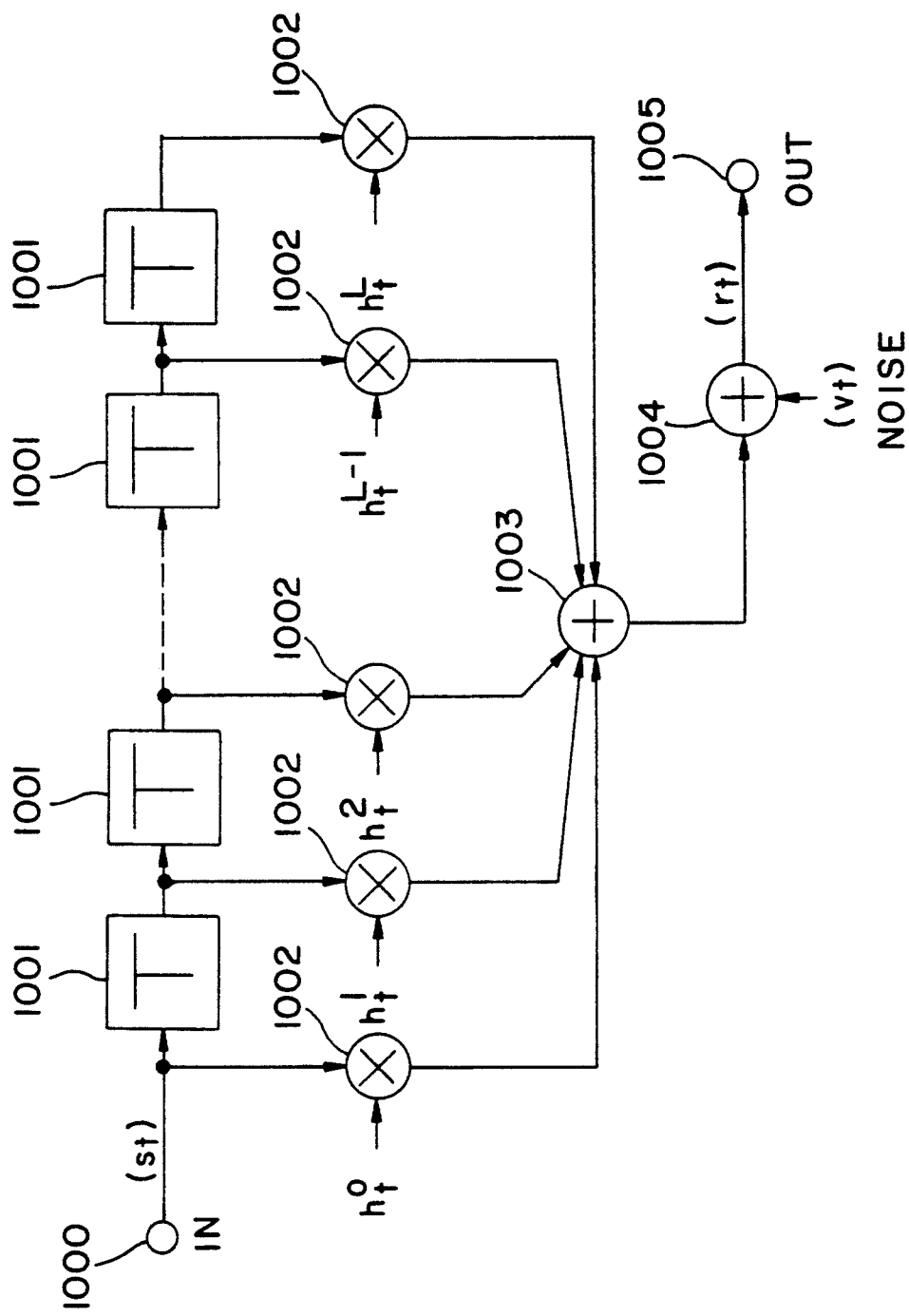
FIG. 10 is an illustration of a channel model.
Figure 11:
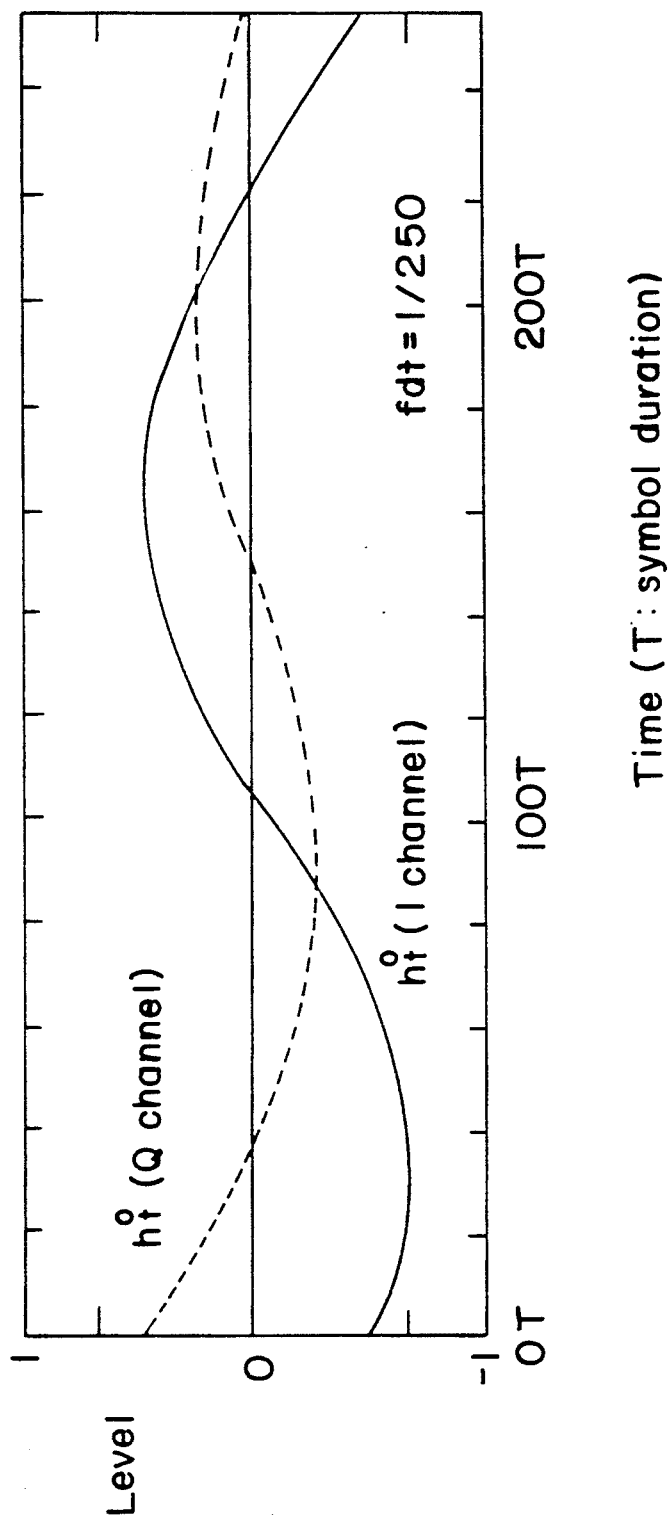
FIG. 11 is an illustration showing variation of the channel impulse response in a time sequence.

The foregoing equation (1) will be hereafter referred to as a channel equation. The channel modeled with this equation is illustrated in FIG. 10. In FIG. 10, the reference numerals 1001 denote delay elements providing a given delay T. The delay elements 1001 are arranged in series for feeding the input signal $S_t$ input through an input terminal 1000 with a given delay period. The inputs for respective delay elements 1001 are also supplied to multipliers 1002. The multipliers 1002 are connected to a common adder 1003 for supplying thereto the products of $\bar{S}_t$ and $\bar{h}_t^T$. The adder 1003 supplies a sum of the outputs of the multipliers 1002 to another adder 1004, to which a noise level $v_t$ is supplied. The adder 1004 outputs a sum as the reception signal $r_t$. Under fading, the transmission response vector $\bar{h}_t$ causes time-variation, as illustrated in FIG. 11, for example.

Figure 13:
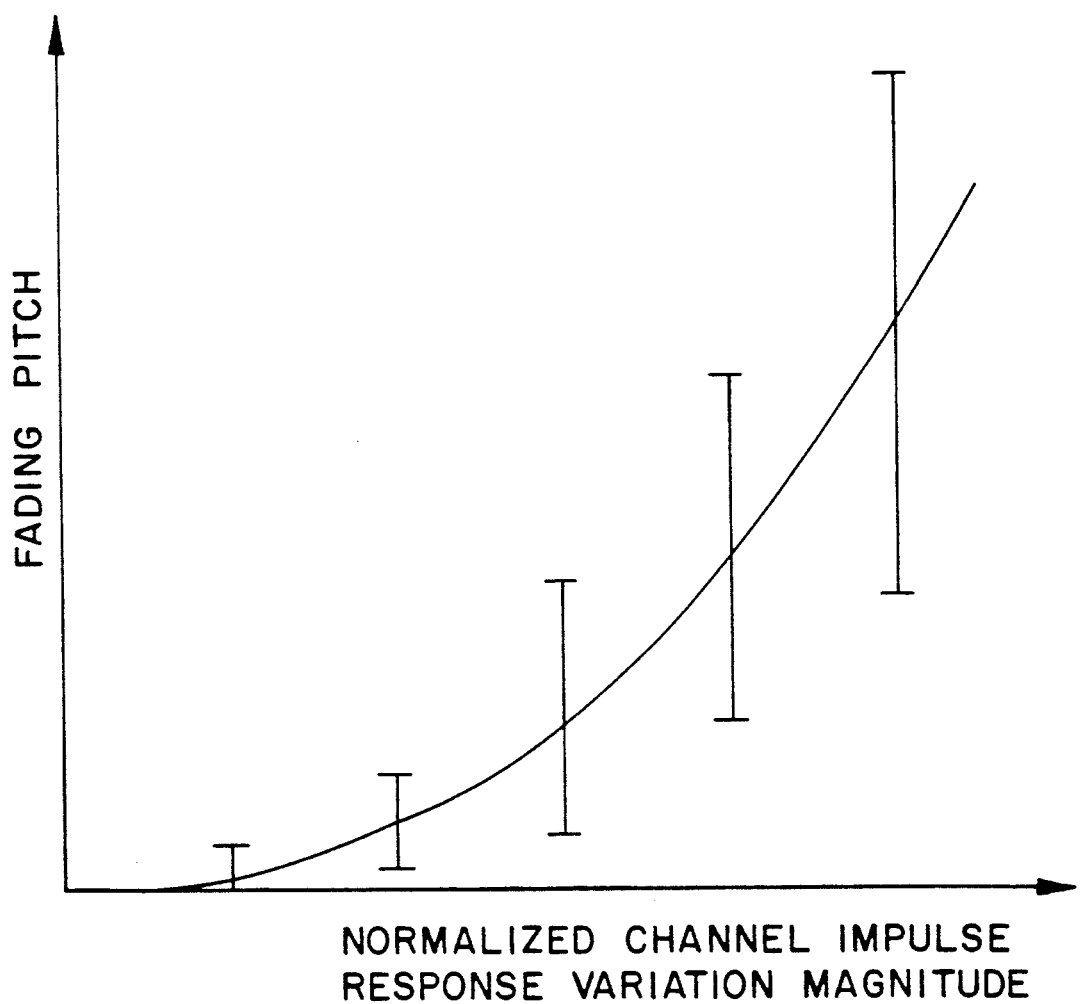
FIG. 13 is an illustration showing the operation of a channel path characteristics variation speed detector.

As set forth above, when the variation of the channel characteristics is moderate, the tracking precision is given higher priority than the tracking speed. Conversely, when the variation of the channel characteristics is rapid, the tracking speed is given higher priority than the tracking precision. Therefore, the coefficients are derived for determining the tracking properties of the adaptive algorithms respectively therefor. On the other hand, a relationship, as illustrated in FIG. 13, is established between a channel characteristics variation speed causing fading (fading pitch) and a variation magnitude within a short period. Namely, although there is some fluctuation depending upon the noise level, the channel characteristics variation speed is generally higher at greater variation magnitude within a given period. Accordingly, the receiver apparatus providing optimal equalization characteristics at any channel characteristics varying condition by initially checking the channel characteristics variation magnitude at a given time interval while monitoring the noise level, subsequently detecting the channel characteristics variation speed from the relationship illustrated in FIG. 13 on the basis of the channel characteristics variation magnitude and the noise level, and varying the tracking property of an equalizer in the following manner (see FIG. 14).

a) In the Case of High Channel Characteristics Variation Speed

If the noise level is low, higher priority is given for the tracking speed. The step size parameter is increased to be greater in case of LMS, or the forgetting factor is decreased to be smaller in case of RLS. On the other hand, when the noise level is high, a balance is established between the tracking speed and the tracking precision. Then, the step size parameter is set at an intermediate value in the case of LMS, and the forgetting factor is set at a center value in the case of RLS.

b) In the Case of Low Channel Characteristics Variation Speed

Irrespective of the noise level, higher priority is given for the tracking precision and, thus, the step size parameter is set to be small value in the case of LMS and the forgetting factor is set to be greater value (or 1) in the case of RLS.

c) In the Case of Medium Channel Characteristics Variation Speed

Irrespective of the noise level, the balance of the tracking speed and the tracking precision is established. Then, the step size parameter is set at an intermediate value in case of LMS and the forgetting factor is set at the center value in case of RLS.

For detecting the noise level, there is a method for detecting based on an error signal given by the adaptive equalizer upon equalization, and a method for indirectly detecting by checking the reception signal level.

In the first aspect of the present invention, the method for detecting the noise level based on the error signal given by the adaptive equalizer upon equalization is employed.

In the second aspect of the present invention, there is a method for detecting the noise level indirectly by checking the reception signal level. It should be noted that, in the second aspect of the invention, the noise level is not positively derived. Thus, detection of the channel characteristics variation speed and control of the tracking property is performed by utilizing the reception signal level instead of the noise level. For instance, in the tracking property control, the high noise level in the foregoing discussion is read as the low reception signal level and the low noise level is read as high reception signal level.

Figure 12:
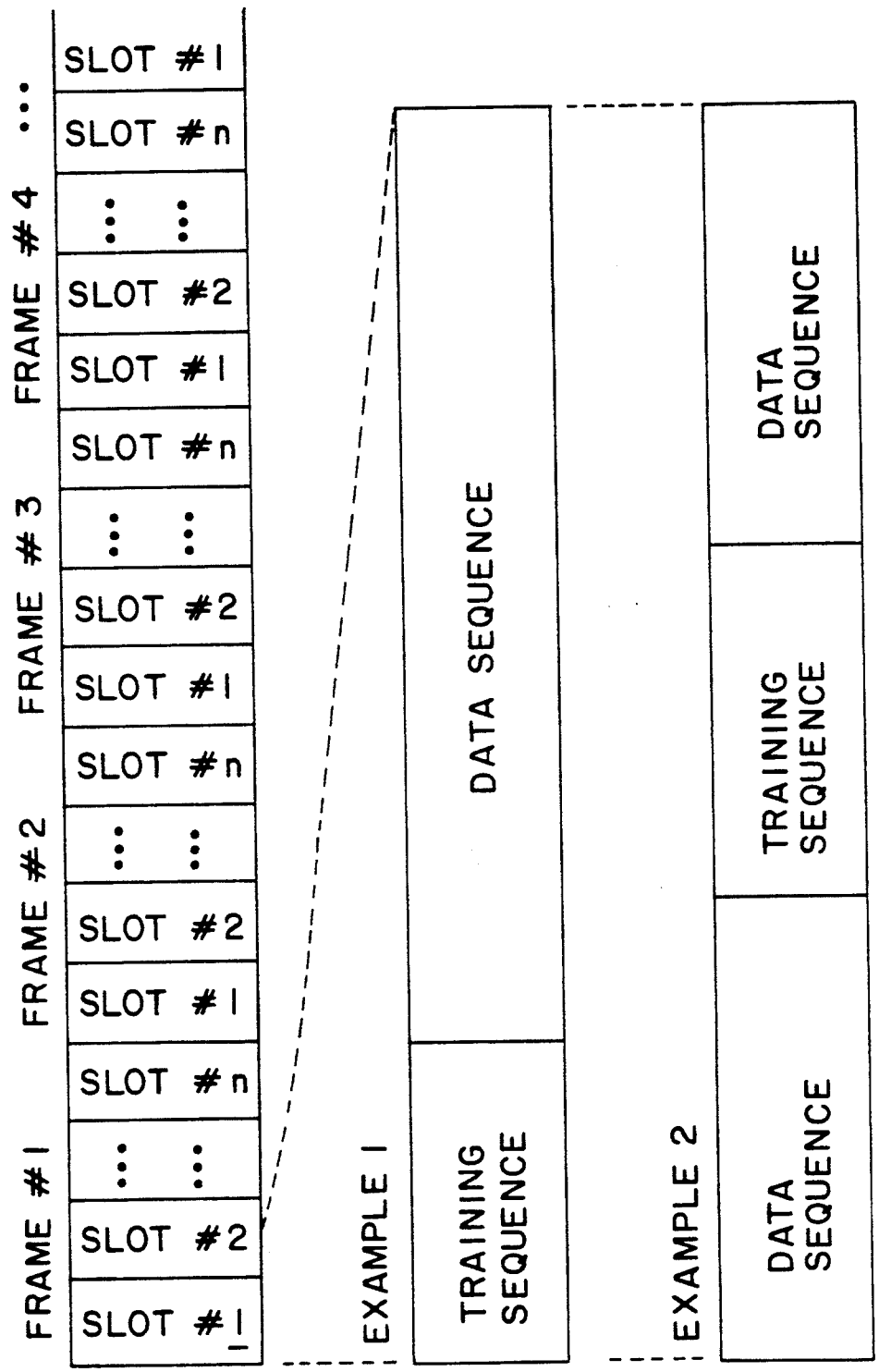
FIG. 12 is an illustration showing a format of a transmitted burst signal.

In a burst signal transmission, a signal is provided a format as illustrated in FIG. 12. Since a time interval between bursts having the same slot number is short, e.g. several tens ms, speed variation of the mobile station can be regarded as moderate in relation of the time interval of the burst. On the other hand, in monitoring a single burst, it is difficult to accurately detect the channel characteristics variation magnitude when the noise level is high.

In the third and fourth aspects of the invention, the channel variation magnitude within a single burst is initially averaged. Subsequently, an average of the channel variation magnitude over a plurality of bursts are derived to vary the tracking property of the adaptive equalizer for each burst. By averaging the channel variation magnitude over a plurality of bursts, the variation speed can be detected with higher precision, so as to permit setting of a further optimal tracking property for the equalizer.

Furthermore, in the adaptive receiver apparatus according to the third and fourth aspects of the invention, a specific period preliminarily determined within the single burst, in which the outputs of the channel characteristics variation magnitude detecting circuit are averaged, is preferably set at a period of a training sequence (see FIG. 12). An error in judgment will never arise since the content of the training sequence is known upon receiving the decision of the transmission signal. A delay in processing the decision is not present, as the decision process is not required, and a failure of estimation of the channel response (discharge of the estimator) due to processing delay will never occur. If the training sequence is sufficiently long to monitor the channel characteristics variation magnitude, an accurate value can be obtained by detecting the channel characteristics variation magnitude only in the training sequence.

Figure 1:
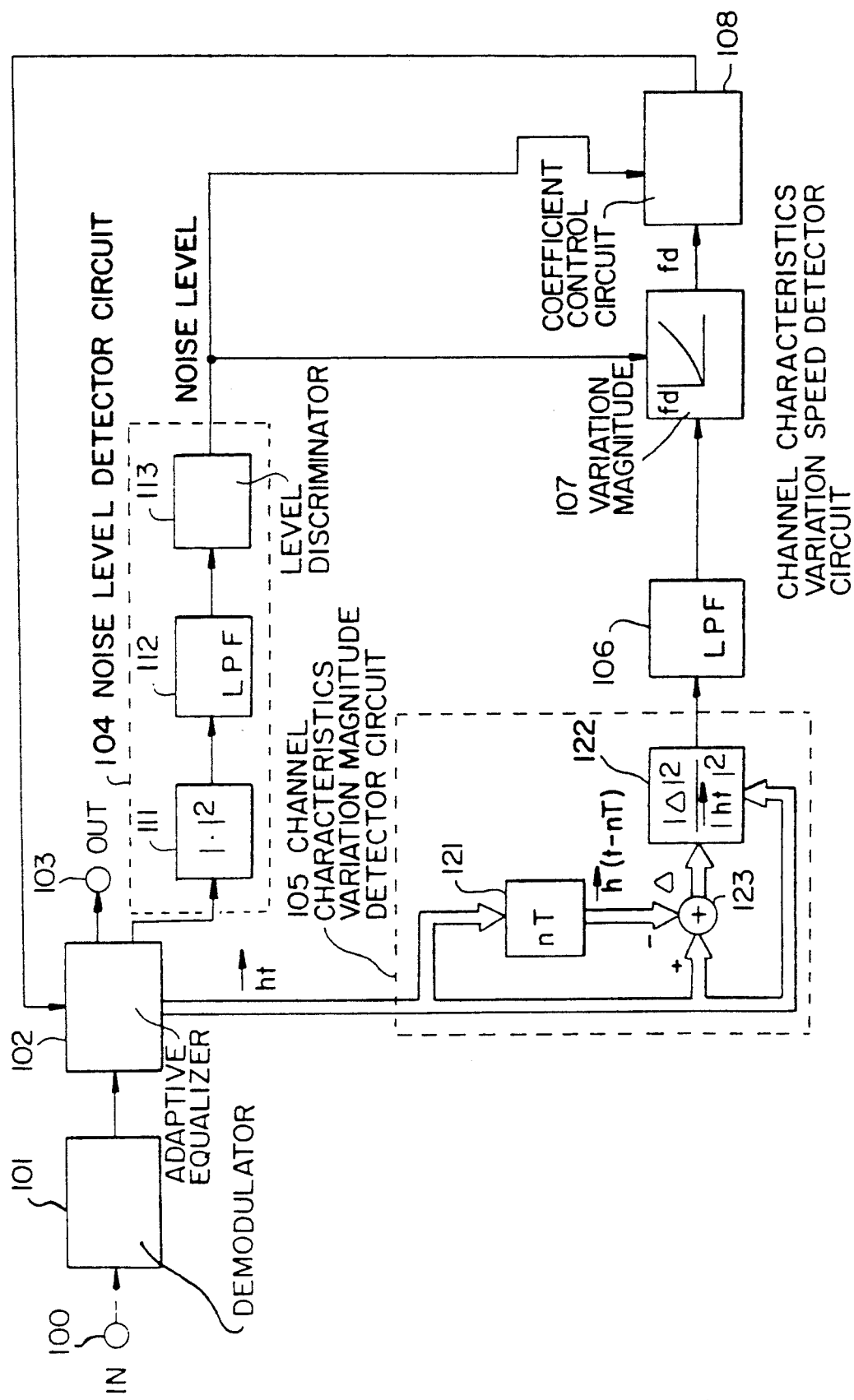
FIG. 1 is a block diagram of the first embodiment of an adaptive receiver apparatus according to the present invention.

Preferred embodiments of the present invention will be discussed herebelow in detail FIG. 1 shows an embodiment of the adaptive receiver apparatus according to the first aspect of the invention. A reception signal input through an input terminal 100 is converted into a base band signal by a demodulator 101 and, then demodulated, matched with a carrier and timed for outputting. The output of the demodulator is equalized by an adaptive equalizer 102. The equalized signal is output through an outputted terminal 103. The adaptive equalizer 102 also outputs an error signal upon equalization to a noise level detector circuit 104 and a channel impulse response estimate vector $h_t$ to a channel characteristics variation magnitude detector circuit 105. On the other hand, the coefficient determining the tracking property of the adaptive algorithm of the adaptive equalizer is adaptively controlled by a coefficient control circuit 108, which will be discussed later.

The noise level detector circuit 104 derives a square value of an absolute value of the error signal upon equalization by a square circuit 111, integrates the square value by a low-pass filter 112 and detects the noise level through discrimination by a level discriminator circuit 113. Namely, when the output of the low-pass filter 112 is large, the noise level is normally high, and, conversely, when the output is small, the noise level is normally low. Accordingly, by comparing the output of the low-pass filter 112 with a predetermined threshold value by the level discriminator circuit 113, the noise level can be discriminated between high level and low level. It may also be possible to provide a plurality of threshold values for performing decisions regarding the noise level at more than two levels.

The channel characteristics variation magnitude detector circuit 105 is supplied a channel impulse response estimate at each timing from the adaptive equalizer 102. Within the channel characteristics variation detector circuit 105, a variation magnitude and vector ($\tilde{h}_t - \tilde{h}_{t-nT}$) between an instantaneous channel impulse response estimate and a delayed channel impulse response estimate delayed by a delay circuit 121 for a predetermined period nT (n is an integer, and T is a symbol time interval) by a subtractor 123, and a square variation magnitude $|\tilde{h}_t - \tilde{h}_{t-nT}|^2 / |\tilde{h}_t|^2$ normalized by a normalization circuit 122 is obtained for outputting. From the output of the channel characteristics variation magnitude detector circuit 105, an impulsive variation is removed by an averaging circuit 106. The low pass filter 106 thus derives an averaged variation magnitude. A channel characteristics variation speed detector 107 detects a variation speed fd from the relationship illustrated in FIG. 13 in terms of the averaged variation magnitude and the output of the noise level detector circuit 104. The coefficient control circuit 108 sets the coefficient for determining the tracking property of the adaptive algorithm of the adaptive equalizer 102 according to the table of FIG. 14 on the basis of the variation speed fd and the output of the noise level detector circuit 104.

In the illustrated embodiment, the coefficient control circuit 108 is set for six coefficients for determining the tracking property of the adaptive algorithm in a discrete manner, as illustrated in FIG. 14. It should be noted that seven or more coefficients may be set by classifying into greater number of levels the noise level and the variation speed fd. It is also possible to set a function for outputting the coefficient of the adaptive algorithm as input conversion for the variation speed and the noise level, and determine the coefficient on the basis of a sequential value derived through the function.

As an example of the coefficient control circuit 108, a ROM (read-only-memory) may be employed. As addresses for the ROM, the noise level and the variation speed are provided, so that coefficients corresponding to the relevant variation speed and the variation magnitude are preliminarily set in the corresponding addresses.

On the other hand, in the construction of the noise level detector 104, the square circuit may be replaced with another non-linear circuit, such as a circuit for deriving an absolute value, to obtain the similar effect.

Figure 6:
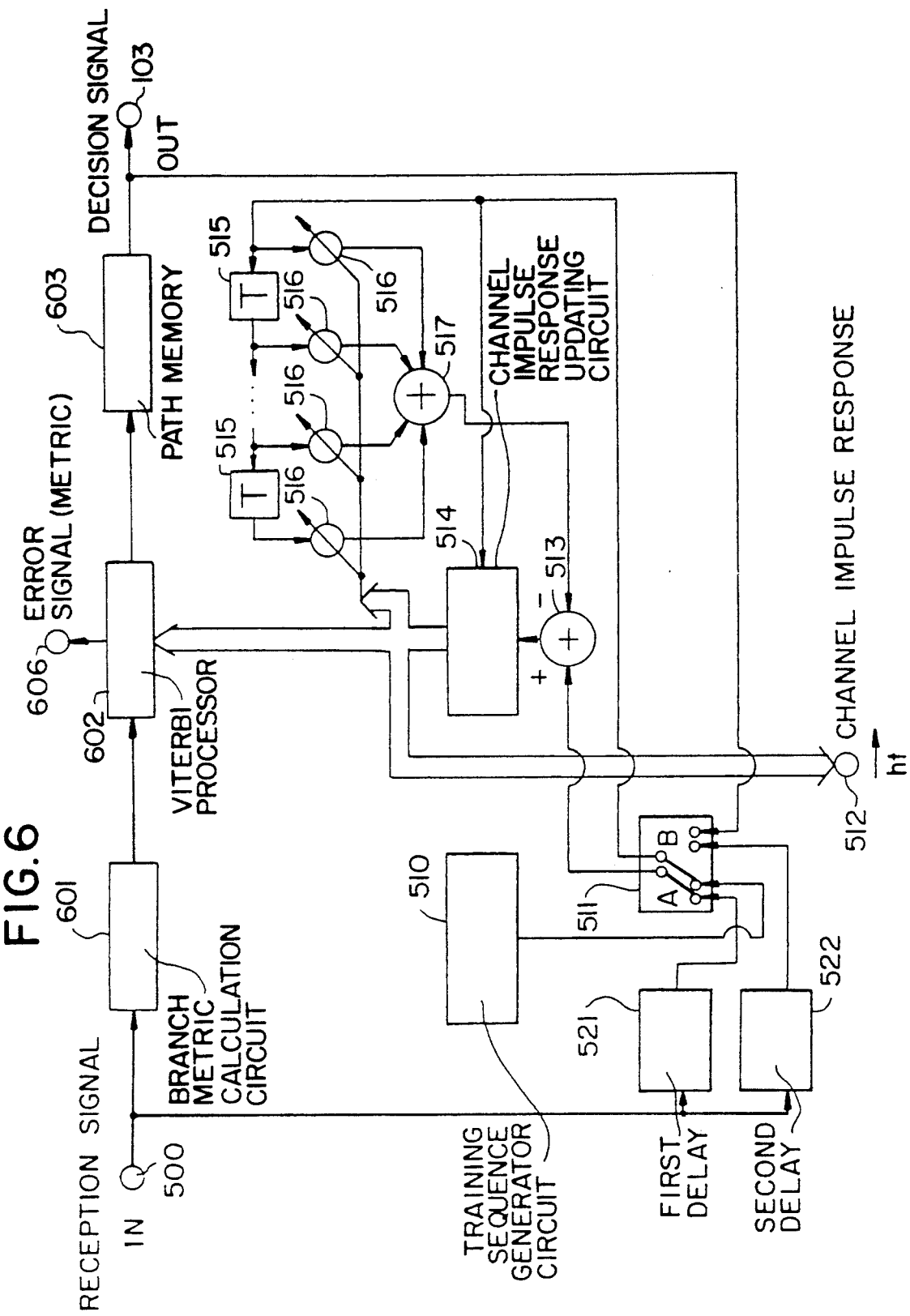
FIG. 6 is a block diagram of a maximum likelihood sequence estimator as the second embodiment of the adaptive equalizer in the embodiments of FIGS. 1 through 4.
Figure 7:
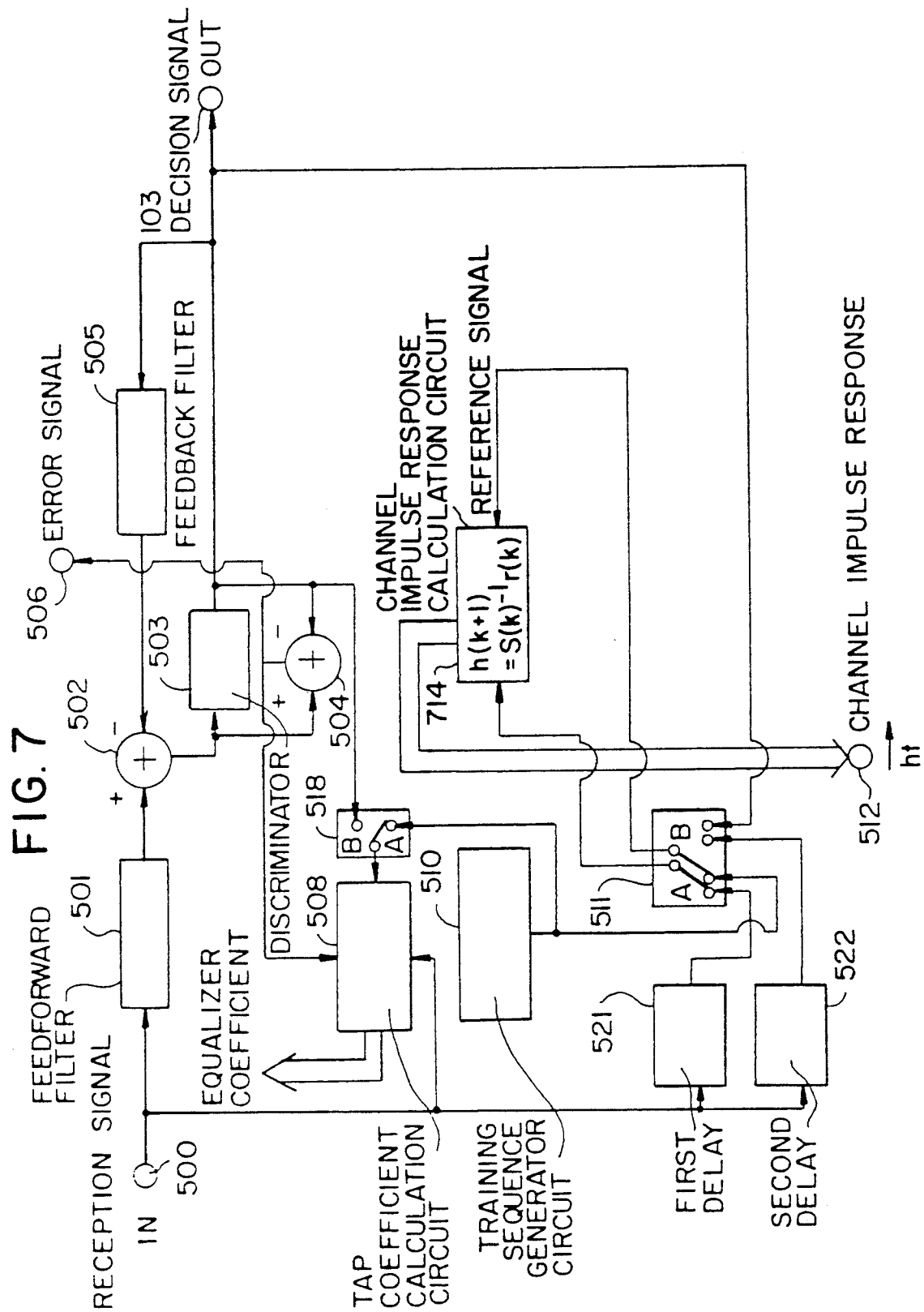
FIG. 7 is a block diagram of a decision feedback type equalizer as the third embodiment of the adaptive equalizer in the embodiments of FIGS. 1 through 4.
Figure 8:
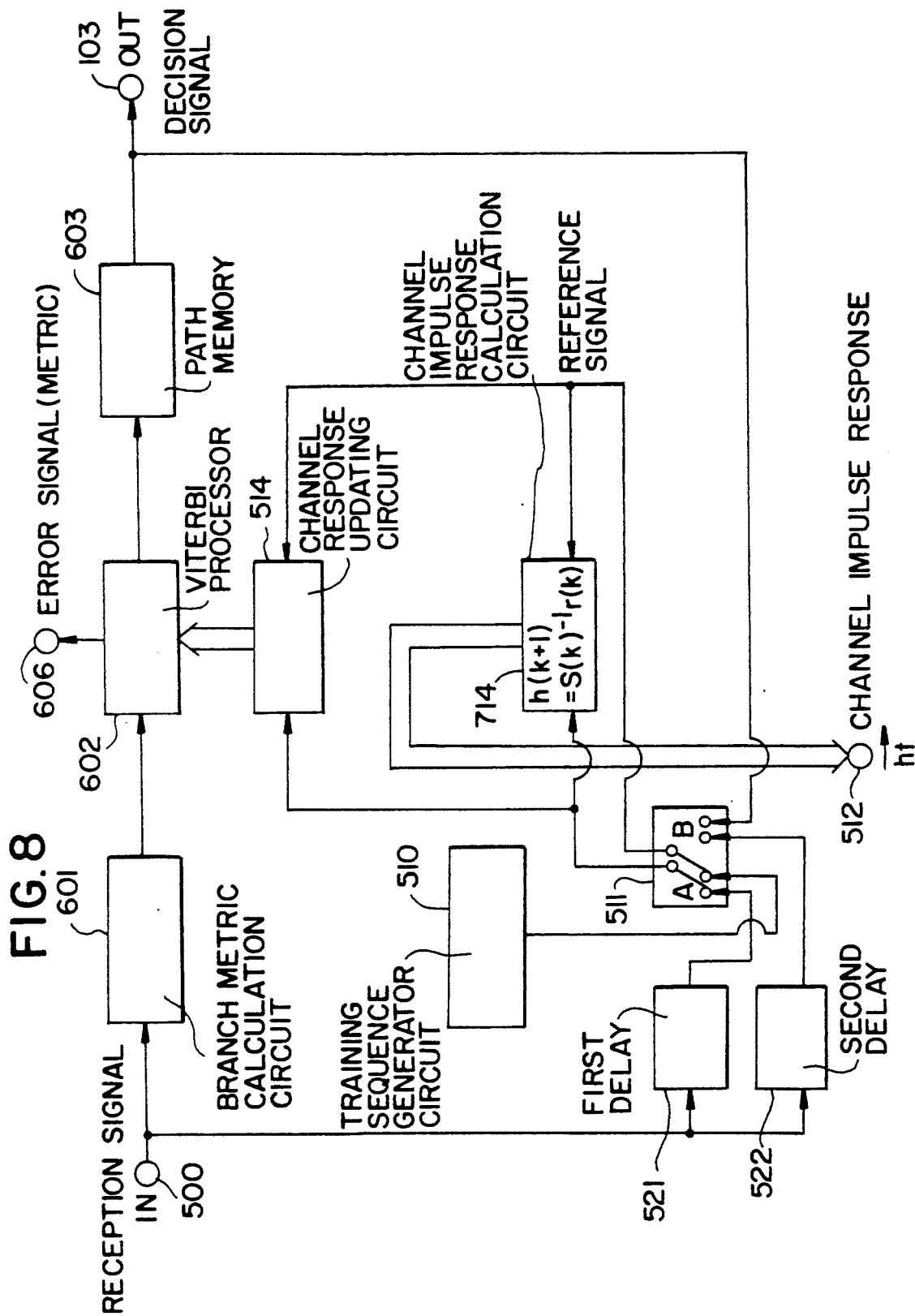
FIG. 8 is a block diagram of a maximum likelihood estimator as the fourth embodiment of the adaptive equalizer in the embodiments of FIGS. 1 through 4.

Various constructions of the adaptive equalizer has been known in the art. The particular point of the present invention resides in a variation detecting means for detecting variation of the channel impulse response and setting of the tracking property of the equalizer on the basis of the detected variation characteristics. Therefore, no particular the equalizer is required. In other words, any construction of equalizer may be applicable. For instance, FIGS. 5 and 7 illustrate decision feedback type equalizers, and FIGS. 6 and 8 illustrate maximum likelihood sequence estimators.

In the equalizer, an equalization error signal is provided by a decision error of the equalizer in the case of a decision feedback type equalizer. Namely, in the constructions illustrated in FIGS. 5 and 7, the equalization error signal is generated by a decision error estimator 504. On the other hand, in the case of the maximum likelihood sequence estimator of FIGS. 6 and 8, the equalization error signal is provided by a maximum likelihood path metric value generated by a Viterbi processor 602.

Figure 5:
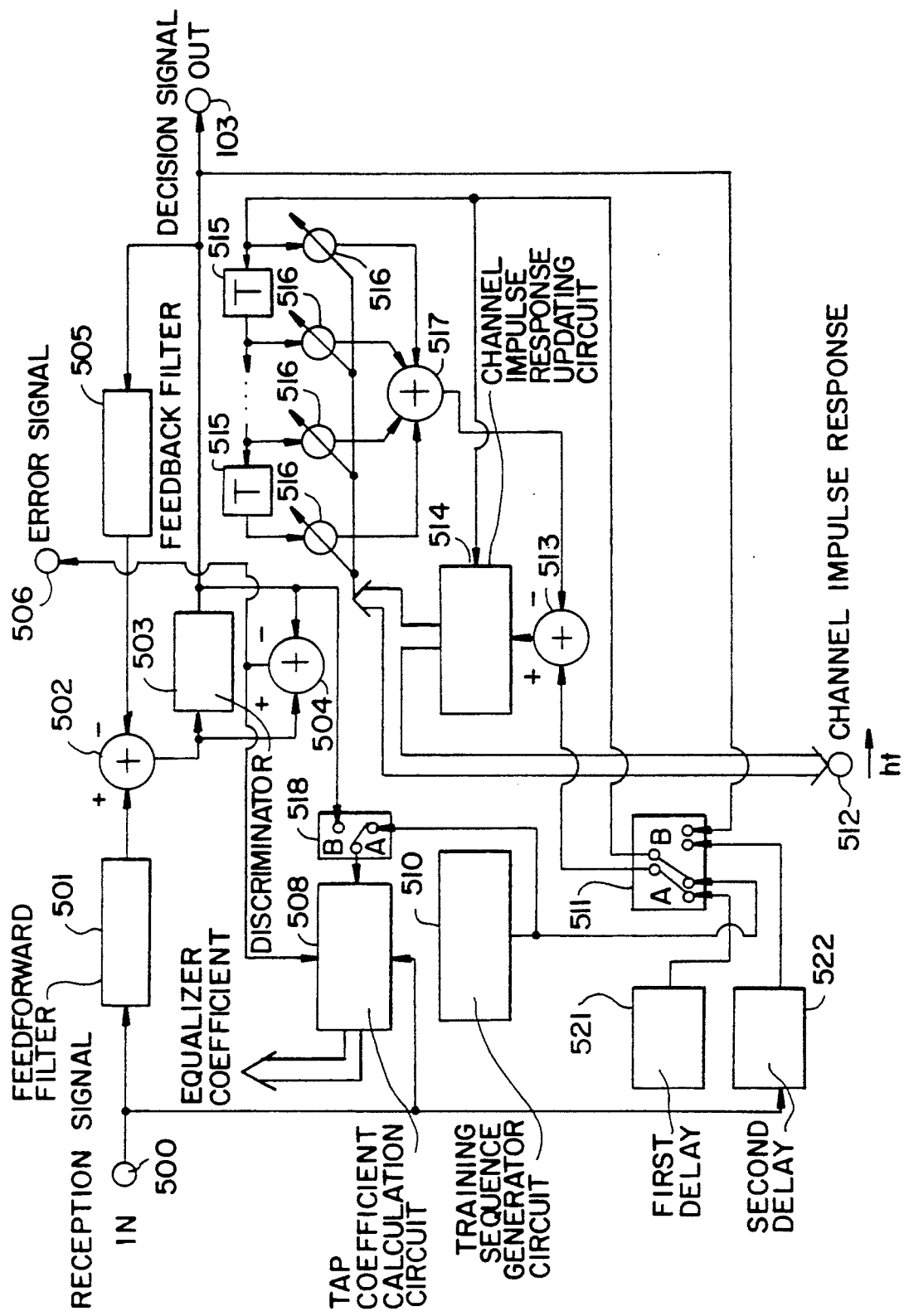
FIG. 5 is a block diagram of a decision feedback type equalizer in the first embodiment of an adaptive equalizer in the embodiments of FIGS. 1 through 4.

In FIG. 5, a base band signal 500 from the demodulator is input to a feed forward filter 501. The output of the feed forward filter 501 is input to an adder 502 at an adding input thereof. A subtracting input of the adder 502 receives an output of a feedback filter 505, to an input of which is an equalized signal output. By this adder 502, a difference between the outputs of the feed forward and feedback filters 501 and 505 is generated. The difference signal thus generated is applied to a discriminator 503. The output of the discriminator 503 is fed out through the equalized signal output terminal 103, as set forth above. The input and output signals of the discriminator 503 are input to a decision error estimator 504 to generate an error therebetween, The error thus generated serves as an difference signal 506 upon equalization.

A tap coefficient calculation circuit 508 is adapted to calculate and set an equalizer coefficients for the feed forward filter 501 and the feed back filter 505 and be operative according to the LMS or the RLS adaptive algorithm. During the training sequence period, the shown tap coefficient calculation circuit 508 calculates the equalizer coefficient based on the output of a training sequence generation circuit 510 as a selected output of a contact A of the switch 518, a training sequence in a reception signal, and further based on the difference signal 506 upon equalization.

On the other hand, during the data sequence period, the tap coefficient calculation circuit 508 derives the equalization coefficient on the basis of the decision signal on the output terminal 103 as a selected output B of the switch 518 and the receiving data sequence, and further based on the difference signal 506 upon equalization.

Delay elements 515, multipliers 516 and an adder 517 forms a reception signal replica generation circuit. A channel impulse response updating circuit 514 is adapted to adaptively estimate the channel impulse response and operate according to the LMS or the RLS adaptive algorithm. The channel impulse response updating circuit 514 supplies the channel impulse response for each multiplier 516 of the reception signal replica generating circuit as a multiplying coefficient. Also, the channel impulse response updating circuit 514 outputs the channel impulse response as a channel impulse response vector $\bar{h}_t$.

The reception signal replica generating circuit generates a replica of the reception signal on the basis of the output of the training sequence generating circuit 510 as the selection output of the contact A of the switch 511 during the training sequence period. On the other hand, during data sequence period, the reception signal replica generating circuit generates the replica of the reception signal on the basis of the decision signal at the output terminal 103 supplied from the discriminator 503 as the selection output of the terminal B of the switch 511.

The replica of the reception signal thus generated is compared by a comparator 513 during the training sequence period, with a reception signal delayed by a delay circuit 521 for a period corresponding to a processing delay of the reception signal replica generating circuit. On the other hand, during the data sequence period, the replica is compared with a reception signal delayed by a delay circuit 522 for a period corresponding to a processing delay in the feedforward filter 501 and the reception signal replica generating circuit, by the comparator 513. The channel impulse response updating circuit 514 adaptively estimates the channel impulse response on the basis of the output of the comparator 513 and the selected output of the switch (i.e. the training sequence or the decision signal).

The coefficient control circuit 108 adaptively derives coefficients which determines the tracking property of the adaptive algorithms of the channel impulse response updating circuit 514 and the tap coefficient calculation circuit 508. As shown in FIG. 6, even in the maximum likelihood sequence estimator, the channel impulse response is estimated in substantially the same manner. The manner of estimation has been discussed in Proakis, "Digital Communication", McGraw-Hill, 1989. The disclosure of the above-identified document is herein incorporated by reference. In FIG. 6, the tracking property of the adaptive algorithm of the channel impulse response updating circuit 514 is adaptively set by the coefficient control circuit 108.

In the case of the decision feedback type equalizer illustrated in FIG. 7 and the maximum likelihood sequence estimator illustrated in FIG. 8, estimation of the channel impulse response to detecting the channel impulse response variation magnitude is derived by performing estimation with a least square method for the channel impulse response vector $\bar{h}_t$ from reception signals at a plurality of timings. Particularly, in FIG. 8, the channel impulse response which is supplied to the Viterbi processor 602 is generated by the transmission response updating circuit 514. The channel impulse response for detecting the channel impulse response variation magnitude is supplied by a transmission response calculation circuit 714. The coefficient control circuit 108 adaptively sets the coefficient for determining the tracking property of the adaptive algorithm, the tap coefficient calculation circuit 508 in case FIG. 7 and the coefficient for determining the tracking property of the adaptive algorithm of the channel impulse response updating circuit 514 in case of FIG. 8.

The least square method for deriving the channel impulse response vector $\bar{h}_t$ is performed in the following manner. Based on N of transmission signal sequence vector $\bar{S}_t$ in a period from a timing t-N+1 and a timing N, a transmission signal sequence $S_t^T$ is defined in the following manner:

$$S_t{}^T = \begin{bmatrix} S_t & S_{t-1} & \cdots & S_{t-L} \\ S_{t-1} & S_{t-2} & \cdots & S_{t-L-1} \\ \cdot & \cdot & & \cdot \\ \cdot & \cdot & & \cdot \\ \cdot & \cdot & & \cdot \\ S_{t-N+1} & S_{t-N} & \cdots & S_{t-L-N+1} \end{bmatrix} \quad (2)$$

On the other hand, the reception signal vector $\bar{r}_t{}^T$ and noise vector $\bar{v}_t{}^T$ are defined in the following manners:

$$\bar{r}_t{}^T = (r_t, r_{t-1}, \ldots, r_{t-N+1}) \quad (3)$$

$$\bar{v}_t{}^T = (v_t, v_{t-1}, \ldots, v_{t-N+1}) \quad (4)$$

From this, the channel equation over N timing can be expressed by the following equation:

$$\bar{r}_t{}^T = S_t{}^T \bar{h}_t + \bar{v}_t{}^T \quad (5)$$

At this time, the channel impulse response vector $h_{t,1s}$ by least square estimation can be expressed by the following equation:

$$\bar{h}_{t,1s} = (S_t{}^T.S_t)^{-1}.S_t{}^T.\bar{r}_t{}^T \quad (6)$$

This manner for estimating the channel impulse response vector $\bar{h}_{t,1s}$ has been discussed in Nakamizo, "Signal Analysis and System Identification", Corona K. K., 1988, for example. The disclosure of the above-identified publication is herein incorporated by reference for the sake of disclosure. Particularly, when the number of reception signals (N) to be used for impulse response estimation is equal to the number of the channel impulse response (L+1), the transmission signal matrix $S_t{}^T$ becomes a square matrix, the channel impulse response estimate by least square estimation can be obtained by simply multiplying the reception signal with the reverse matrix of the transmission signal matrix $S_t{}^T$, as expressed in the following equation.

$$\bar{h}_{t,1s} = S_t{}^{-1}.\bar{r}_t{}^T \quad (7)$$

In the channel impulse response calculation circuit 714 performs estimateion of the channel impulse response for detecting variation magnitude of the channel impulse response by performing calculation according to the foregoing equation (6) or (7).

Figure 2:
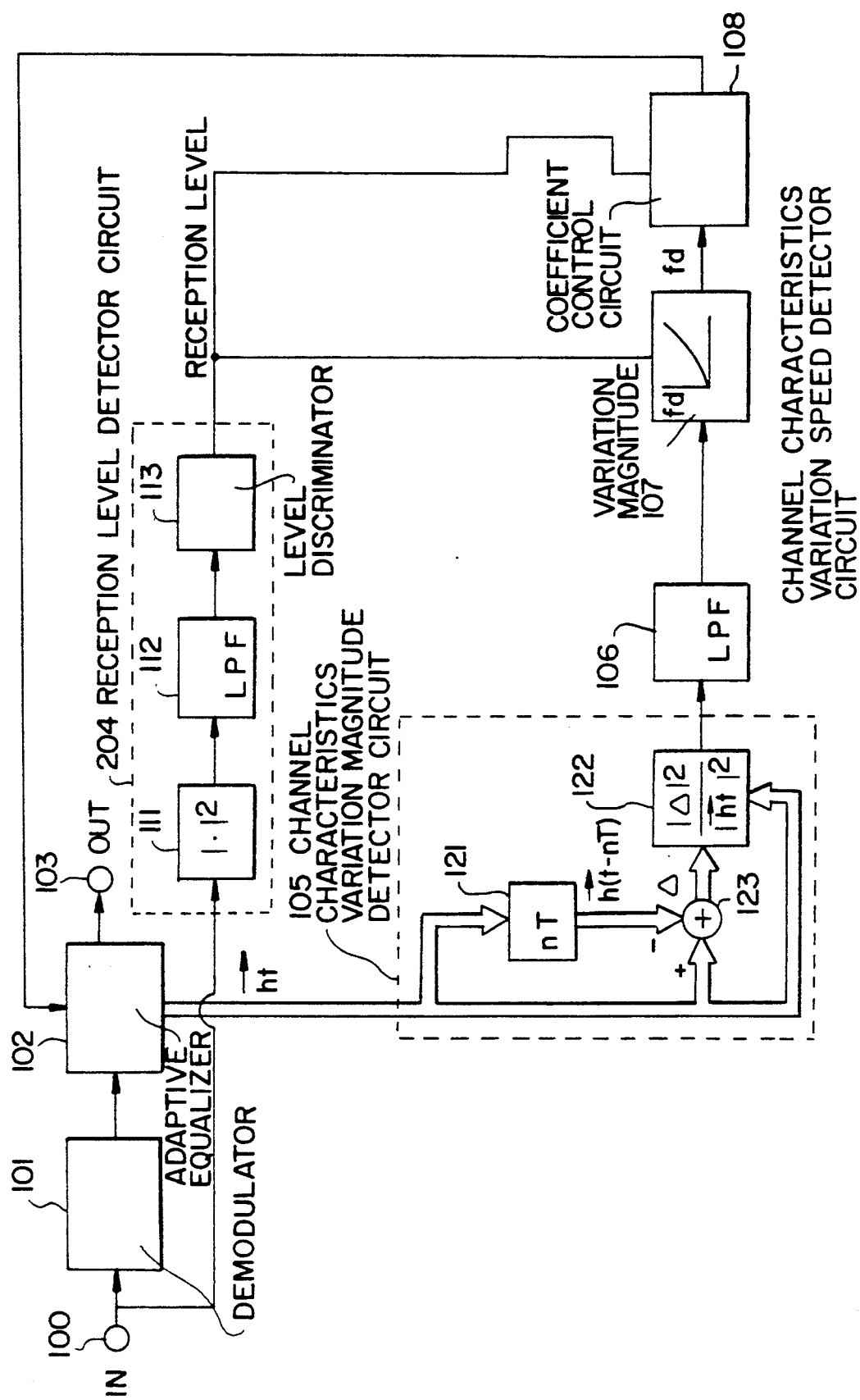
FIG. 2 is a block diagram of the second embodiment of an adaptive receiver apparatus according to the present invention.

FIG. 2 is a block diagram showing the second embodiment of the adaptive receiver apparatus according to the second aspect of the invention. The reception signal input through the input terminal 100 is demodulated by the demodulator 101. The output of the demodulator 102 is equalized by the adaptive equalizer 102. The equalized signal is output through the output terminal 103. The adaptive equalizer 102 also outputs the channel impulse response estimate vector $\bar{h}_t$ to a channel characteristics variation magnitude detector circuit 105 together with the equalization output. On the other hand, the coefficient determining the tracking property of the adaptive algorithm of the adaptive equalizer is adaptively controlled by a coefficient control circuit 108.

A reception level detector circuit 204 derives a square value of an absolute value of the reception signal by the square circuit 111, integrates the square value by a low-pass filter 112 and discriminates the reception level through a decision by the level discriminator circuit 113. Namely, when the output of the low-pass filter 112 is large, the reception level is normally high. Conversely, when the output is small, the reception level is normally low. Accordingly, by comparing the output of the low-pass filter 112 with the predetermined threshold value by the level discriminator circuit 113, the reception level can be discriminated between high level and low level. It may also be possible to provide a plurality of threshold values for performing decision of the noise level at more than two levels.

The channel characteristics variation magnitude detector circuit 105 is supplied a channel impulse response estimate at each timing from the adaptive equalizer 102. The channel characteristics variation detector circuit 105 outputs a normalized square value of the variation magnitude. The output of the channel characteristics variation magnitude detector circuit 105 is removed an impulsive variation by the averaging circuit 106. The averaging circuit 106, thus, derives an averaged variation magnitude. The channel characteristics variation speed detector 107 detects a variation speed fd in terms of the averaged variation magnitude and the output of the reception level detector circuit 204. The coefficient control circuit 108 sets the coefficient for determining the tracking property of the adaptive algorithm of the adaptive equalizer 102 according to the table of FIG. 15, on the basis of the variation speed fd and the output of the reception level detector circuit 204.

In the shown embodiment, the coefficient control circuit 108 is set for six coefficients for determining the tracking property of the adaptive algorithm in discrete manner, as illustrated in FIG. 15. It should be noted that seven or more coefficients may be set by classifying into greater number of levels, i.e. seven levels or more, for the reception level and the variation speed fd. It is also possible to set a function for outputting the coefficient of the adaptive algorithm as input conversion for the variation speed and the reception level and determine the coefficient on the basis of a sequential value derived through the function.

Figure 3:
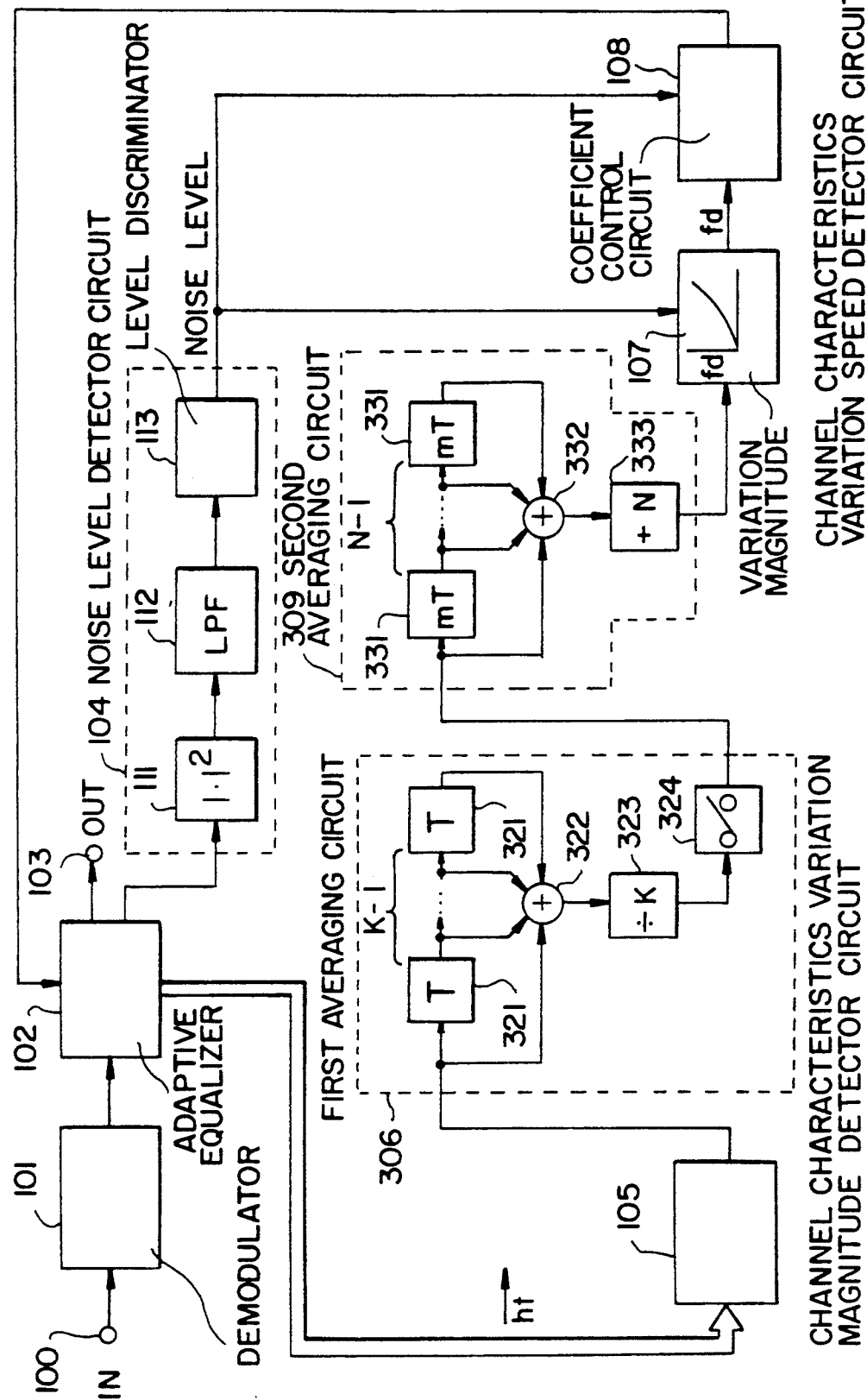
FIG. 3 is a block diagram of the third embodiment of an adaptive receiver apparatus according to the present invention.

FIG. 3 is a block diagram showing the third embodiment of the adaptive receiver apparatus, according to the third aspect of the invention. The reception signal input through the input terminal 100 is demodulated by the demodulator 101. The output of the demodulator 102 is equalized by the adaptive equalizer 102. The equalized signal is output through the output terminal 103. The adaptive equalizer 102 also outputs the channel impulse response estimate vector $\bar{h}_t$ to a channel characteristics variation magnitude detector circuit 105 together with the equalization output. On the other hand, the coefficient determining the tracking property of the adaptive algorithm of the adaptive equalizer is adaptively controlled by a coefficient control circuit 108. It should be noted that the noise level detector circuit 104 discriminates the noise level.

The channel characteristics variation magnitude detector circuit 105 receives the channel impulse response estimate at each timing from the adaptive equalizer 102 and outputs a normalized sequence value of the variation magnitude. The output channel characteristics variation magnitude detector circuit 105 is averaged by a first averaging circuit 306 over a period of KT (K is an arbitrary integer, T is a symbolic time interval) in a burst for removing the impulsive variation component. This can be done by storing the output of the channel characteristics variation magnitude detector circuit 105 over a KT period by a delay element 321, by obtaining a sum thereof by an adder 322, and by obtaining an average value by a divider 323. As the output of the first averaging circuit 306, an averaged variation magnitude within one burst is output per each burst by a switch 324. A second averaging circuit 309 derives an average of N outputs (N is a arbitrary integer) of the first averaging circuit 309 so as to obtain an averaged channel characteristics variation magnitude over N bursts. This permits detection of the channel characteristics variation magnitude with higher precision. The second averaging circuit 309 includes a delay element 331 which provides a delay for the output of the first averaging circuit 306 for a period mT (m is a number of symbol within the single burst) corresponding to a one burst period, and thus stores the output of the first averaging circuit 306 corresponding to each burst.

The channel characteristics variation speed detector circuit 107 detects the variation speed fd from the averaged variation magnitude provided as the output of the second averaging circuit 309 and the output of the noise level detector 104. The coefficient control circuit 108 sets a coefficient for determining the tracking property of the adaptive algorithm of the adaptive equalizer 102 according to FIG. 14.

Even in the shown embodiment, the coefficient control circuit 108 determines the coefficient for determining the tracking property of the adaptive algorithm in discrete manner as illustrated in FIG. 14. It is possible to classify the noise level and the variation speed fd into greater numbers for setting a plurality of coefficients. Also, it is possible to set a function for outputting the coefficient of the adaptive algorithm as input conversion for the variation speed and the noise level, and determine the coefficient on the basis of a sequential value derived through the function.

Figure 4:
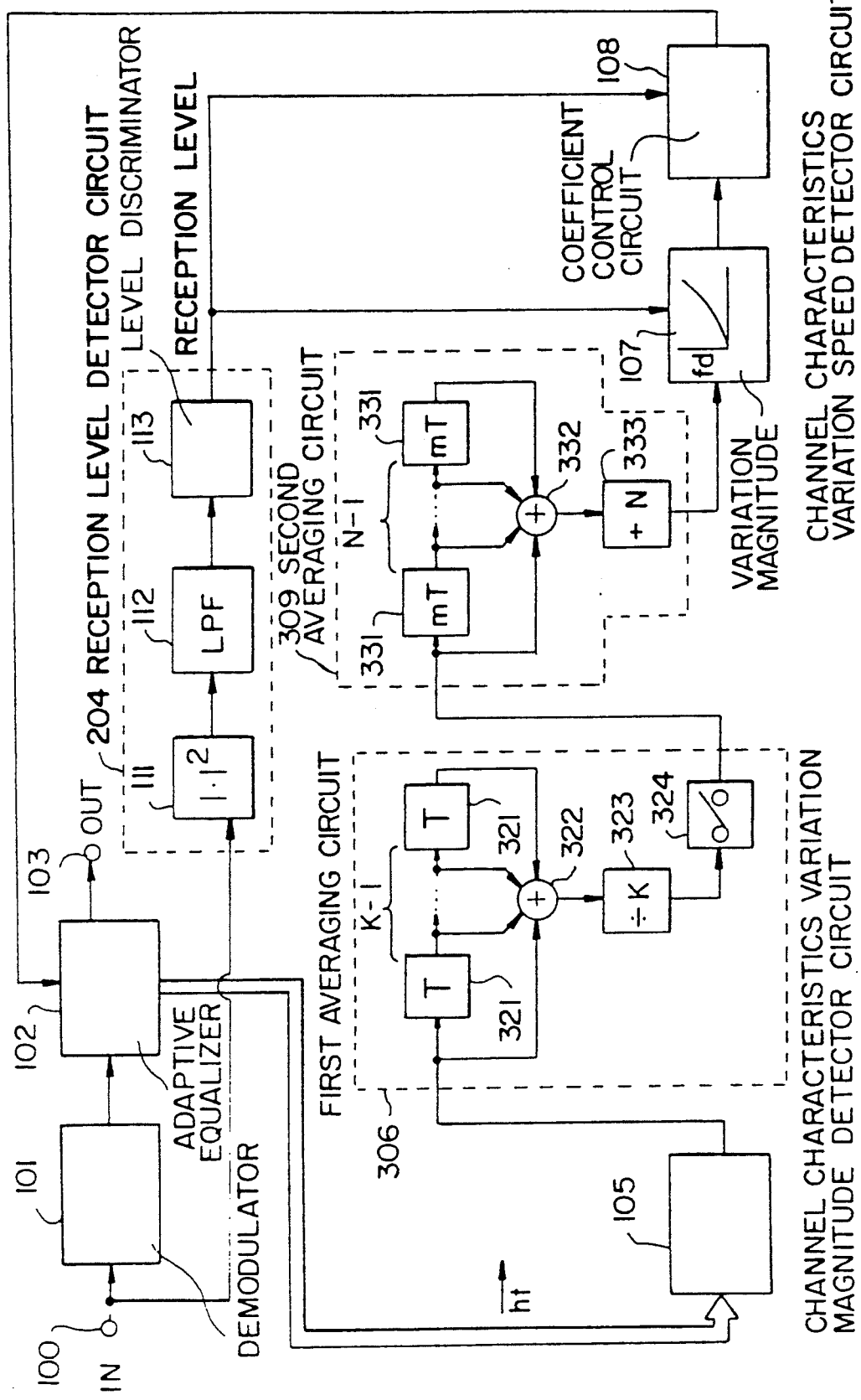
FIG. 4 is a block diagram of the fourth embodiment of an adaptive receiver apparatus according to the present invention.

FIG. 4 is a block diagram showing the fourth embodiment of the adaptive receiver apparatus according to the fourth aspect of the invention. The reception signal input through the input terminal 100 is demodulated by the demodulator 101. The output of the demodulator 102 is equalized by the adaptive equalizer 102. The equalized signal is output through the output terminal 103. The adaptive equalizer 102 also outputs the channel impulse response estimate vector $\overline{h}_t$ to a channel characteristics variation magnitude detector circuit 105 together with the equalization output. On the other hand, the coefficient determining the tracking property of the adaptive algorithm of the adaptive equalizer is adaptively controlled by a coefficient control circuit 108.

A reception level detector circuit 204 derives a square value of an absolute value of the reception signal by the square circuit 111, integrates the square value by a low-pass filter 112 and discriminates the reception level through a decision by the level discriminator circuit 113. Namely, when the output of the low-pass filter 112 is large, the reception level is normally high, and, conversely, when the output is small, the reception level is normally low. Accordingly, by comparing the output of the low-pass filter 112 with the predetermined threshold value by the level discriminator circuit 113, the reception level can be discriminated between high level and low level. It may also be possible to provide a plurality of threshold values for performing decision of the reception level at more than two levels.

The channel characteristics variation magnitude detector circuit 105 is at each timing supplied a channel impulse response estimate at each timing from the adaptive equalizer 102 and outputs a normalized sequence value of the variation magnitude. The output of channel characteristics variation magnitude detector circuit 105 is averaged by a first averaging circuit 306 over a period of KT (K is a arbitrary integer, T is a symbolic time interval) in a burst for removing impulsive variation component. This can be done by storing the output of the channel characteristics variation magnitude detector circuit 105 over KT period by a delay element 321, by obtaining a sum thereof by an adder 322, and by obtaining an average value by a divider 323. As the output of the first averaging circuit 306, an averaged variation magnitude within one burst is output per each burst by a switch 324. A second averaging circuit 309 derives an average of N outputs (N is a arbitrary integer) of the first averaging circuit 309 so as to obtain an averaged channel characteristics variation magnitude over N bursts. This permits detection of the channel characteristics variation magnitude with higher precision. The second averaging circuit 309 includes a delay element 331 which provides a delay for the output of the first averaging circuit 306 for a period mT (m is a number of time symbols within the single burst) corresponding to a one burst period, and thus stores the output of the first averaging circuit 306 corresponding to each burst.

The channel characteristics variation speed detector circuit 107 detects the variation speed fd from the averaged variation magnitude provided as the output of the second averaging circuit 309 and the output of the reception level detector 104. The coefficient control circuit 108 sets a coefficient for determining the tracking property of the adaptive algorithm of the adaptive equalizer 102 according to FIG. 15.

Even in the shown embodiment, the coefficient control circuit 108 sets the coefficients for determining the tracking property of the adaptive algorithm in a discrete manner, as illustrated in FIG. 15. It should be noted that seven or more coefficients may be set by classifying into greater number of levels the noise level and the variation speed fd. It is also possible to set a function for outputting the coefficient of the adaptive algorithm as an input conversion for the variation speed and the reception level, and determine the coefficient on the basis of a sequential value derived through the function. Furthermore, when the training sequence is sufficiently long for monitoring channel characteristics variation, the predetermined specific period KT is preliminarily set in each burst for averaging the outputs of the channel characteristics variation magnitude detector circuit. The adaptive receivers of FIGS. 3 and 4 are preferably set at the period of the training sequence.

As set forth above, according to the present invention, the variation of the channel impulse response can be detected, based on the reception signal. The tracking property of the receiver apparatus can be adaptively determined on the basis of the detected variation speed. Therefore, according to the present invention, an adaptive receiver can equalize the wave form with an optimal equalizer at any condition.

Although the invention has been illustrated and described with respect to exemplary embodiments thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims.

What is claimed is:

1. An adaptive receiver apparatus comprising:
   demodulating means for demodulating a reception signal;
   adaptive equalization means for equalizing a demodulated output to output an equalized signal, an difference signal upon equalization and a channel impulse response estimate estimated upon equalization;
   noise level detecting means for detecting a noise level based on said difference signal upon equalization;
   channel impulse response variation magnitude detecting means for detecting a variation magnitude of said channel impulse response estimate at a predetermined interval; and
   coefficient control means for adjusting a coefficient determining a tracking property of an adaptive algorithm of said adaptive equalization means depending upon the variation magnitude of said channel impulse response estimate detected by the channel impulse response variation magnitude detecting means and said noise level detected by said noise level detecting means.

2. An adaptive receiver apparatus as set forth in claim 1, wherein said adaptive algorithm is a least-means-squares (LMS) algorithm, and said coefficient is a step size parameter.

3. An adaptive receiver apparatus as set forth in claim 1, wherein said adaptive algorithm is a recursive-least-squares (RLS) algorithm, and said coefficient is a forgetting factor.

4. An adaptive receiver apparatus comprising:
   demodulating means for demodulating a reception signal;
   adaptive equalization means for equalizing a demodulated output to output an equalized signal, an difference signal upon equalization and a channel impulse response estimate estimated upon equalization;
   signal level detecting means for receiving a signal level of said reception signal
   channel impulse response variation magnitude detecting means for detecting a variation magnitude of said channel impulse response estimate at a predetermined interval; and
   coefficient control means for adjusting a coefficient determining a tracking property of an adaptive algorithm of said adaptive equalization means depending upon the variation magnitude of said channel impulse response estimate detected by the channel impulse response variation magnitude detecting means and said signal level detected by said signal level detecting means.

5. An adaptive receiver apparatus for receiving a burst transmission signal with adaptive equalization according to an adaptive algorithm, comprising:
   demodulating means for demodulating a reception signal;
   adaptive equalization means for equalizing a demodulated output to output an equalized signal, an difference signal upon equalization and a channel impulse response estimate estimated upon equalization;
   noise level detecting means for detecting a noise level based on said difference signal upon equalization;
   channel impulse response variation magnitude detecting means for detecting a variation magnitude of said channel impulse response estimate at a predetermined interval;
   first averaging means for averaging outputs of said channel impulse response variation magnitude detecting means over a given period within a burst with respect to each burst;
   second averaging means for averaging the outputs of said first averaging means over a plurality of bursts; and
   coefficient control means for adjusting a coefficient determining a tracking property of the adaptive algorithm of said adaptive equalization means depending upon the output of said second averaging means and said noise level detected by said noise level detecting means, with respect to each burst.

6. An adaptive receiver apparatus as set forth in claim 5, wherein said given period in said burst, over which said first average means active for averaging is a training sequence period.

7. An adaptive receiver apparatus for receiving a burst transmission signal with adaptive equalization according to an adaptive algorithm, comprising:
   demodulating means for demodulating a reception signal;
   adaptive equalization means for equalizing a demodulated output to output an equalized signal, an difference signal upon equalization and a channel impulse response estimate estimated upon equalization;
   signal level detecting means for detecting a signal level of said reception signal;
   channel impulse response variation magnitude detecting means for detecting a variation magnitude of said channel impulse response estimate at a predetermined interval;
   first averaging means for averaging outputs of said channel impulse response variation magnitude detecting means over a given period within a burst with respect to each burst;
   second averaging means for averaging the outputs of said first averaging means over a plurality of bursts; and
   coefficient control means for adjusting a coefficient determining a tracking property of the adaptive algorithm of said adaptive equalization means depending upon the output of said second averaging means and said signal detected by said signal level detecting means, with respect to each burst.

8. An adaptive receiver apparatus as set forth in claim 7, wherein said given period in said burst, over which said first average means active for averaging is a training sequence period.

9. An adaptive receiver apparatus comprising:
   demodulating means for demodulating a reception signal;
   adaptive equalization means for equalizing a demodulated output to output an equalized signal, an difference signal upon equalization and a channel characteristics representative parameter estimated upon equalization;

channel status detecting means for detecting an channel status representative parameter affecting reception of said reception signal;

channel characteristics variation magnitude detecting means for detecting a variation magnitude of said channel characteristics representative parameter at a predetermined interval; and coefficient control means for adjusting a coefficient determining a tracking property of an adaptive algorithm of said adaptive equalization means depending upon the variation magnitude of said channel characteristics representative parameter and said the channel status representative parameter.

10. An adaptive receiver apparatus for receiving a burst transmission signal with adaptive equalization according to an adaptive algorithm, comprising:

demodulating means for demodulating a reception signal;

adaptive equalization means for equalizing a demodulated output to output an equalized signal, an difference signal upon equalization and a channel characteristics representative parameter estimated upon equalization;

channel status detecting means for detecting an channel status representative parameter affecting reception of said reception signal;

channel characteristics variation magnitude detecting means for detecting a variation magnitude of said channel characteristics representative parameter at a predetermined interval;

first averaging means for averaging outputs of said channel characteristics variation magnitude detecting means over a given period within a burst with respect to each burst;

second averaging means for averaging the outputs of said first averaging means over a plurality of bursts; and coefficient control means for adjusting a coefficient determining a tracking property of the adaptive algorithm of said adaptive equalization means depending upon the output of said second averaging means and said channel status detecting means, with respect to each burst.

11. An adaptive receiver apparatus for a mobile communication system, comprising:

demodulating means for receiving a radio wave signal and demodulating the received signal into a demodulated signal;

equalizing means for equalizing said demodulated signal according to an adaptive algorithm to output an equalized signal, said adaptive algorithm being provided a tracking property variable depending upon a coefficient;

estimating means for estimating a channel characteristics representative parameter and for generating a first parameter on the basis of said demodulated signal and a reference signal, said reference signal is a training signal during a training sequence period and is otherwise said equalized signal;

detector means for detecting a channel status affecting reception of said radio wave signal to produce a second parameter;

coefficient determining means for determining said coefficient on the basis of a variation of said first parameter and said second parameter for providing an optimal tracking property for said adaptive algorithm.

* * * * *